United States Patent
Seki et al.

(10) Patent No.: US 8,053,784 B2
(45) Date of Patent: Nov. 8, 2011

(54) SILICON CARBIDE SEMICONDUCTOR DEVICE AND METHOD FOR MANUFACTURING THE SAME

(75) Inventors: Akinori Seki, Shizuoka (JP); Yukari Tani, Nagoya (JP); Noriyoshi Shibata, Nagoya (JP)

(73) Assignees: Toyota Jidosha Kabushiki Kaisha, Toyota-shi, Aichi-ken (JP); Japan Fine Ceramics Center, Nagoya-shi, Aichi (JP)

( * ) Notice: Subject to any disclaimer, the term of this patent is extended or adjusted under 35 U.S.C. 154(b) by 290 days.

(21) Appl. No.: 12/376,362

(22) PCT Filed: Aug. 7, 2007

(86) PCT No.: PCT/JP2007/065403
§ 371 (c)(1),
(2), (4) Date: Feb. 4, 2009

(87) PCT Pub. No.: WO2008/018432
PCT Pub. Date: Feb. 14, 2008

(65) Prior Publication Data
US 2010/0224884 A1    Sep. 9, 2010

(30) Foreign Application Priority Data
Aug. 8, 2006 (JP) .................. 2006-215999

(51) Int. Cl.
*H01L 29/15* (2006.01)
(52) U.S. Cl. ... 257/77; 257/368; 257/616; 257/E21.051; 257/E21.054; 257/E21.065; 438/590; 438/767

(58) Field of Classification Search .................. 438/197, 438/478, 503, 505–508, 585, 590, 763, 767; 257/77, 288, 368, 613, 616, E21.041, E21.049, 257/E21.051, E21.054, E21.09, E21.065, 257/E21.092, E21.093, E21.618, E21.633, 257/E29.104; 977/721, 773, 778, 779, 784, 977/891, 936
See application file for complete search history.

(56) References Cited

U.S. PATENT DOCUMENTS

| | | | | |
|---|---|---|---|---|
| 6,090,666 | A * | 7/2000 | Ueda et al. | 438/257 |
| 7,071,512 | B2 * | 7/2006 | Nakagawa et al. | 257/324 |
| 7,781,102 | B2 * | 8/2010 | Graetz et al. | 429/226 |
| 2003/0102490 | A1 | 6/2003 | Kubo et al. | |
| 2003/0146473 | A1 * | 8/2003 | Inoue et al. | 257/346 |

(Continued)

FOREIGN PATENT DOCUMENTS
JP    8-70124    3/1996
(Continued)

OTHER PUBLICATIONS

German Office Action for German Appl. No. 11 2007 001 860.7-33 dated Oct. 22, 2010.

(Continued)

*Primary Examiner* — Laura Menz
*Assistant Examiner* — Joseph C Nicely
(74) *Attorney, Agent, or Firm* — Finnegan, Henderson, Farabow, Garrett & Dunner, LLP (57) ABSTRACT

A channel layer (40) for forming a portion of a carrier path between a source electrode (100) and a drain electrode (110) is formed on a drift layer (30). The channel layer (40) includes Ge granular crystals formed on the drift layer (30), and a cap layer covering the Ge granular crystals.

8 Claims, 11 Drawing Sheets

U.S. PATENT DOCUMENTS

| | | | |
|---|---|---|---|
| 2003/0203599 A1* | 10/2003 | Kanzawa et al. | 438/478 |
| 2004/0206950 A1* | 10/2004 | Suvkhanov et al. | 257/19 |
| 2005/0045892 A1 | 3/2005 | Hayashi et al. | |
| 2005/0224838 A1 | 10/2005 | Tanaka et al. | |
| 2006/0118915 A1* | 6/2006 | Hwang | 257/616 |
| 2006/0225642 A1* | 10/2006 | Kanzawa et al. | 117/89 |

FOREIGN PATENT DOCUMENTS

| | | |
|---|---|---|
| JP | 9-74193 | 3/1997 |
| JP | 3307184 | 5/2002 |
| JP | 2004-134644 | 4/2004 |
| JP | 2005-294611 | 10/2005 |
| JP | 2005-303025 | 10/2005 |
| JP | 2005-303027 | 10/2005 |
| JP | 2005-353877 | 12/2005 |
| JP | 2006-80273 | 3/2006 |

OTHER PUBLICATIONS

Chen, Z, et al., "A Light-Activated SiC Darlington Transistor Using SiCGe as Base Layer," Chinese Phys. Lett., vol. 20, No. 3, pp. 430-432, 2003.

* cited by examiner

SILICON CARBIDE SEMICONDUCTOR DEVICE AND METHOD FOR MANUFACTURING THE SAME

TECHNICAL FIELD

The present invention relates to a semiconductor device using silicon carbide (SiC) and a method for manufacturing the same.

BACKGROUND ART

In recent years, a field effect transistor (FET) having a gate electrode disposed between a source electrode into which a current flows and a drain electrode from which it flows out for controlling the current (drain current) between source/drain by a voltage applied to the gate electrode has been proposed. The field effect transistor includes an MOS type (MOSFET) having a MOS structure fir the gate and a junction type using a pn junction or a Schottky junction.

In MOSFET having the MOS structure for the gate electrode, the conductivity of a channel region through which the drain current flows is controlled by utilizing that an inversion layer due to minor carriers is formed on the surface of a semiconductor. Then, since the current value changes when a gate voltage is changed, it can function for amplification of electric signals or as a current on/off switch.

As described above, the semiconductor device having the MOS structure for the gate includes a silicon carbide semiconductor device (MOSFET) using a semiconductor including silicon carbide (refer, for example, to Japanese Patent No. 3307184).

DISCLOSURE OF THE INVENTION

Subject to be Solved by the Invention

However, in the silicon carbide (SiC), since the mobility of carriers is generally small, the MOS interfacial characteristic is insufficient, and the channel mobility of the MOS transistor is small, there has been a problem that on resistance is high and current loss increases when it is formed as a device.

The present invention has been accomplished in view of the existent problems described above and intends to provide a silicon carbide semiconductor device having a large mobility of carriers in the channel forming region, a low on resistance, and excellent in the device characteristic, as well as a manufacturing method thereof.

Means for Solving the Subject

A silicon carbide semiconductor device of the invention for solving the subject described above is a silicon carbide semiconductor device that controls the flow of carriers between a source region and a drain region by a gate voltage, comprising a silicon, carbide substrate, and a channel layer that is disposed on or above the silicon carbide substrate, constitutes at least a portion of a carrier flow path between the source region and the drain region, and contains $Si_{1-x}Ge_xC$ crystals ($0 \leq x < 1$) and Ge granular crystals at a higher Ge concentration than that of the $Si_{1-x}Ge_xC$ crystals.

The silicon carbide semiconductor device of the invention has a channel layer containing $Si_{1-x}Ge_xC$ crystals ($0 \leq x < 1$) and Ge granular crystals at a higher Ge concentration than that of the $Si_{1-x}Ge_xC$ crystals as at least a portion of a carrier flow path between the source region and the drain region. Since the channel layer of the invention contains the Ge granular crystals having larger mobility and lattice constant and smaller forbidden band width compared with those of silicon carbide, the mobility of carriers in the channel forming region is large, on resistance is low, and device characteristic is excellent.

The silicon carbide semiconductor device of the invention may further has a contact layer on or above the channel layer. By the provision of the contact layer to the silicon carbide semiconductor device of the invention, the contact resistance of the source electrode and the drain electrode can be reduced.

In the silicon carbide semiconductor device of the invention, the Ge granular crystals may be in contact with the silicon carbide substrate and the contact layer. With such a constitution of the silicon carbide semiconductor device of the invention, the silicon carbide semiconductor substrate and the contact layer can be connected through the Ge granular crystals of large mobility, and a semiconductor layer having a effectively high Ge concentration can be obtained. As a result, the mobility of the carriers can be improved further.

In the silicon carbide semiconductor device of the invention, the contact layer may include Ge granular crystals formed on the surface of the channel layer or it may further contain $Si_{1-x}Ge_xC$ crystals ($0 \leq x < 1$) at a lower Ge concentration than that of the Ge granular crystals. With such a constitution of the contact layer, the contact resistance of the source electrode and the drain electrode can be decreased further.

The method for manufacturing the silicon carbide semiconductor device of the invention is a method for manufacturing the silicon carbide semiconductor device of the invention described above which includes, at a temperature of 1400° C. or less, forming Ge granular crystals by supplying a gas mixture containing a germanium materials on or above a silicon carbide substrate or on or above a channel layer thereby growing Ge granular crystals on the surface of the silicon carbide substrate or the surface of the channel layer In a case where the temperature is higher than 1400° C. the Ge granular crystals sublime and the Ge granular crystals cannot be formed on the surface of the silicon carbide substrate or on the surface of the channel layer. According to the Ge granular crystal forming process described above, the Ge granular crystals can be formed on the surface of the silicon carbide substrate or on the surface of the channel layer.

The method for manufacturing the silicon carbide semiconductor device of the invention may further include forming a cap layer by supplying a gas mixture containing a silicon material (for example, a silane compound), a carbon material (for example, hydrocarbon compound) and, optionally, a germanium material (for example, organic germanium compound) on or above the silicon carbide substrate on which the Ge granular crystals have been formed or on or above the channel layer on which the Ge granular crystals have been formed while heating from a temperature that is equal to or lower than the Ge granular crystal growing temperature in the forming of the Ge granular crystals up to a temperature of 1400 to 2000° C., thereby epitaxially growing $Si_{1-x}Ge_xC$ crystals ($0 \leq x < 1$) covering the Ge granular crystals to Thrift the cap layer comprising the $Si_{1-x}Ge_xC$ crystals ($0 \leq x < 1$) on the surface of the silicon carbide substrate or the surface of the channel layer.

According to the cap layer forming process described above, the Ge granular crystals do not sublime and a cap layer including the $Si_{1-x}Ge_xC$ crystals ($0 \leq x < 1$) can be formed. The cap layer can suppress sublimation of the Ge granular crystals upon high temperature heating.

In the cap layer forming process, the cap layer may be formed while elevating the temperature continuously from a temperature that is equal to or lower than the Ge granular crystal growing temperature up to a temperature of 1400 to 2000° C., or a cap layer may be formed to a predetermined film thickness at a temperature that is equal to or lower than the Ge granular crystal growing temperature, and then a cap layer may further be formed while elevating the temperature up to 1400 to 2000° C.

Effect of the Invention

The present invention provides a silicon carbide semiconductor device having a large mobility of carriers in the channel forming region, a low on resistance, and excellent in the device characteristics, as well as a manufacturing method thereof.

BEST MODE FOR CARRYING OUT THE INVENTION

A silicon carbide semiconductor device and a manufacturing method thereof according to the present invention are to be described with reference to the drawings. Throughout the drawings, those having identical functions carry the same references and descriptions therefor are sometimes omitted.

Figure 1:
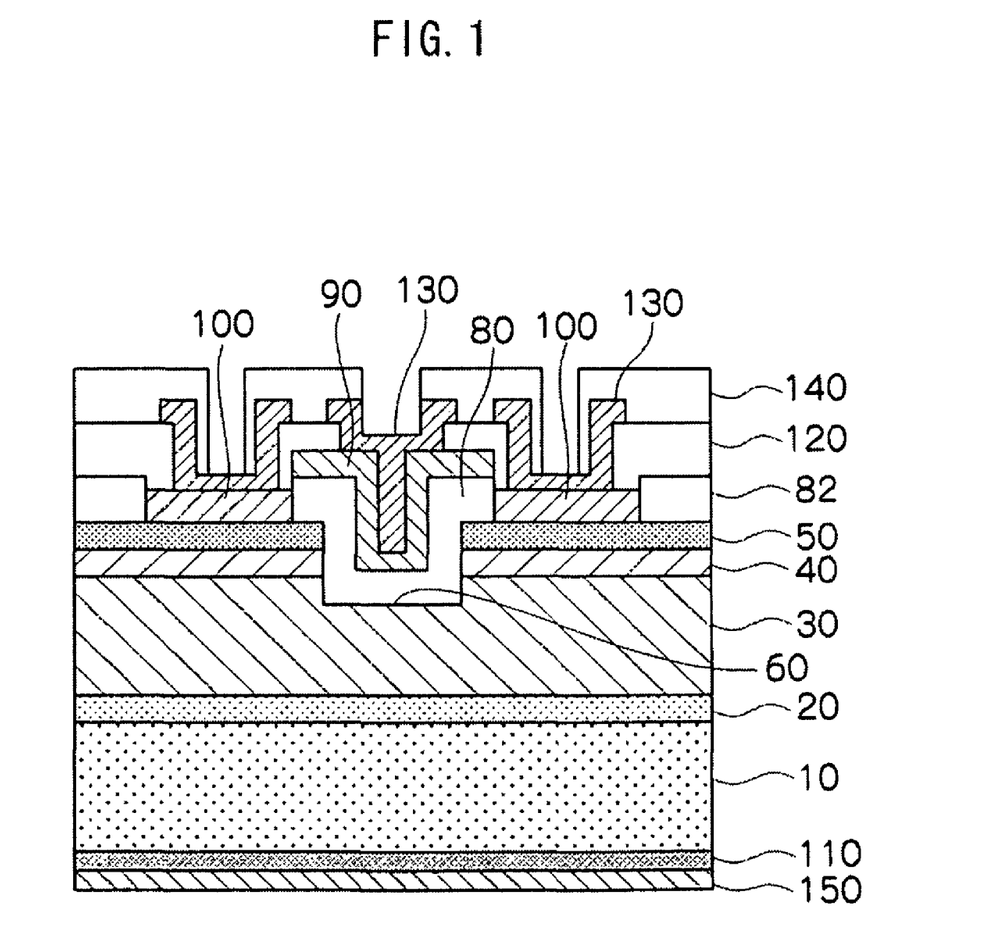
FIG. 1 is a cross sectional view showing a first embodiment of a silicon carbide semiconductor device of the invention.

FIG. 1 is a cross sectional view showing a first embodiment of a silicon carbide semiconductor device of the invention. The silicon carbide semiconductor device of this embodiment is constructed as vertical MOS type field effect transistor (MOSFET) in which a gate electrode is constituted as a MOS structure and carriers move in the vertical direction for vertically traversing the inside of the device between the source electrode disposed on one surface of a silicon carbide substrate and a drain electrode disposed on the side opposite to the source electrode forming surface.

In MOSFET of this embodiment, an SiC buffer layer 20 ($N^+$; $N_2$-doped, carrier concentration: $3 \times 10^{18}$ $cm^{-3}$) of 1 μm thickness, an SiC drift layer 30 ($N^-$; $N_2$-doped, carrier concentration: $5 \times 10^{15}$ $cm^{-3}$) of 10 μm thickness, a channel layer 40 of 2 μm thickness including Ge granular crystals ($P^-$; Al-doped, carrier concentration: $5 \times 10^{15}$ $cm^{-3}$) disposed on the SiC drift layer 30 and having 0.5 μm height in the direction of the thickness of the SiC substrate 10 and a cap layer ($P^-$; Al-doped, carrier concentration: $5 \times 10^{15}$ $cm^{-3}$) of 2 μm thickness covering the Ge granular crystals, and an SiC contact layer 50 ($N^+$; $N_2$-doped, carrier concentration: $3 \times 10^{18}$ $cm^{-3}$ or higher) of 0.5 μm thickness are stacked in this order on the single crystal silicon carbide substrate (SiC substrate) 10 (4H—SiC (0001) 8° off toward [11-20] carrier concentration ($N^+$; $3 \times 10^{18}$ $cm^{-3}$) 350 μm thickness).

The thickness of the SiC substrate 10 is not particularly restricted and can be selected properly within a range, for example, of from 100 to 500 μm. The thickness of the buffer layer 20 is properly selected within a range of from 0.1 to 2.0 μm. The thickness of the drift layer 30 is properly selected within a range of from 5 to 15 μm. The thickness of the channel layer 40 is properly selected within a range of from 0.5 to 5.0 μm. The thickness of the contact layer 50 is properly selected within a range of from 0.1 to 1.0 μm.

A gate trench 60 passing through the contact layer 50 and the channel layer 40 and reaching the drift layer 30 is formed on the side of the SiC substrate 10 where the buffer layer 20 and the like are stacked.

A gate insulating film 80 including $SiO_2$ is formed on the surface of the gate trench 60. The thickness of the gate insulating film 80 is selected properly within a range of from 20 to 100 nm. The gate insulating film 80 is formed so as to cover a portion of the surface of the contact layer 50 and functions as an insulating layer 82. The thickness of the insulating layer 82 can be properly selected within a range of from 20 to 100 nm.

The surface of the gate insulating film 80 is covered with a gate electrode 90. A source electrode 100 is formed on the surface of a portion of the contact layer 50 (surface not formed with the insulating layer 82). Further, a drain electrode 110 is formed on the side of the SiC substrate 10 opposite to the side where the buffer layer 20, etc. are stacked. Further, on the drain electrode 110, a rear face electrode 150 for mounting to the package of the semiconductor device is disposed.

The gate electrode 90 and the insulating layer 82 are covered with an inter-layer insulating film 120 including $SiO_2$. The thickness of the inter-layer insulating film 120 can be properly selected within a range of from 0.1 to 2.0 μm.

On the inter-layer insulating film 120, an interconnection electrode 130 in contact with the source electrode 100 and the gate electrode 90 is formed, and a surface protection layer 140 including $SiO_2$ is formed so as to cover the interconnection electrode 130. The thickness of the surface protection layer 140 can be selected properly within a range of from 0.1 to 2.0 μm.

The operation principle of the silicon carbide semiconductor device according to the first embodiment is to be described. When a voltage is applied to the gate electrode 90, the conduction type of the channel layer 40 is reversed to form a channel region and carriers flow between the source electrode 100 and the drain electrode 110. The channel layer 40 is a channel forming region. Since the channel layer 40 contains Ge granular crystals of large mobility of carriers, the silicon carbide semiconductor device according to this embodiment has low on resistance and is excellent in device characteristics.

A manufacturing process of the silicon carbide semiconductor device according to the first embodiment (method for manufacturing the silicon carbide semiconductor device of the invention) is to be described with reference to FIG. 2 to FIG. 13.

At first, a SiC substrate 10 (4H—SiC (0001) 8° off toward [11-20] carrier concentration ($N^+$: $3\times10^{18}$ $cm^{-3}$), 350 μm thickness) is prepared and a buffer layer 20 ($N^+$; $N_2$-doped, carrier concentration: $3\times10^{18}$ $cm^{-3}$, 1 μm thickness) and a drift layer 30 ($N^-$; $N_2$-doped, carrier concentration: $5\times10^{15}$ $cm^{-3}$, 10 μm thickness) are epitaxially grown in this order on the surface of the SiC substrate 10 by a CVD method.

Before forming the buffer layer 20, the SiC substrate 10 is preferably heated at 1400 to 2000° C. in an $H_2$ atmosphere to remove the surface defects. Usually, the surface of the semiconductor substrate contains crystal defects generated during polishing. The crystal defects form a path for carrier killers or leak current. The crystal defects can be removed by removing the surface of the substrate by heating to improve carrier mobility. The amount of removal is preferably from 0.05 to 2 μm.

The buffer layer 20 and the drift layer 30 are formed at 1400 to 2000° C. (substrate temperature) by using a silane compound $SiH_4$ as a silicon material, a hydrocarbon compound $C_3H_8$ as a carbon material, $N_2$, $AsH_3$, $PH_3$, etc. as a n-type conduction material and $H_2$ as a carrier gas. As the silicon material, organic silane (tetraethyl silane) or $SiH_xCl_{4-x}$ (0≦x<4) can be used in addition to $SiH_4$. As the carbon material, $CH_4$, $C_2H_2$, $C_2H_6$, $C_2H_4$, etc. can be used instead of $C_3H_8$. As the carrier gas, Ar can be used in addition to $H_2$.

Figure 2:
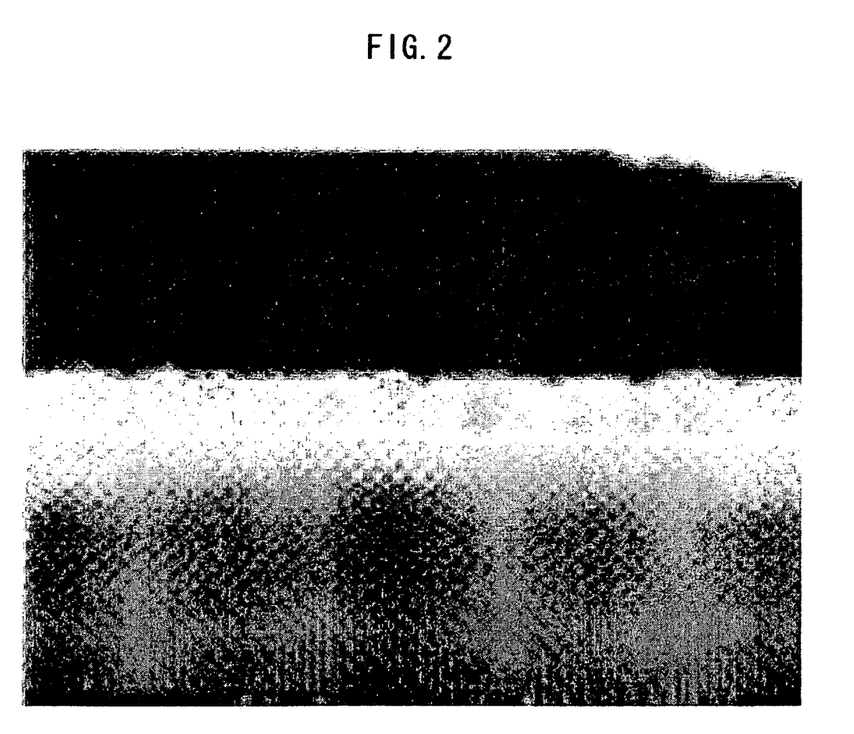
FIG. 2 is a cross sectional photograph showing Ge granular crystals.
Figure 3:
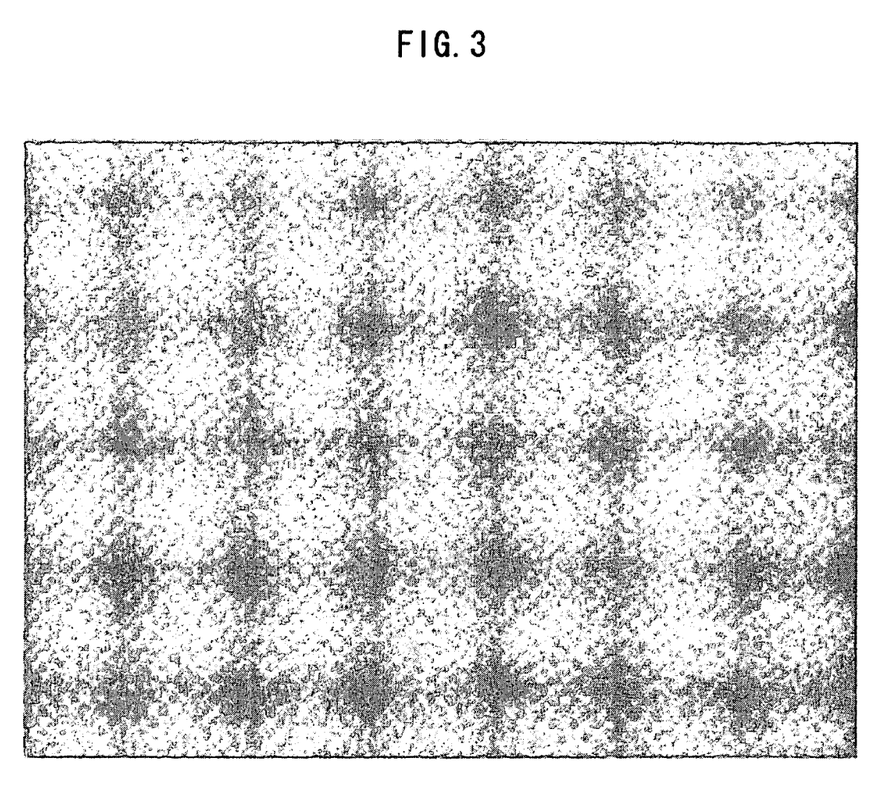
FIG. 3 is a surface photograph showing Ge granular crystals.
Figure 17:
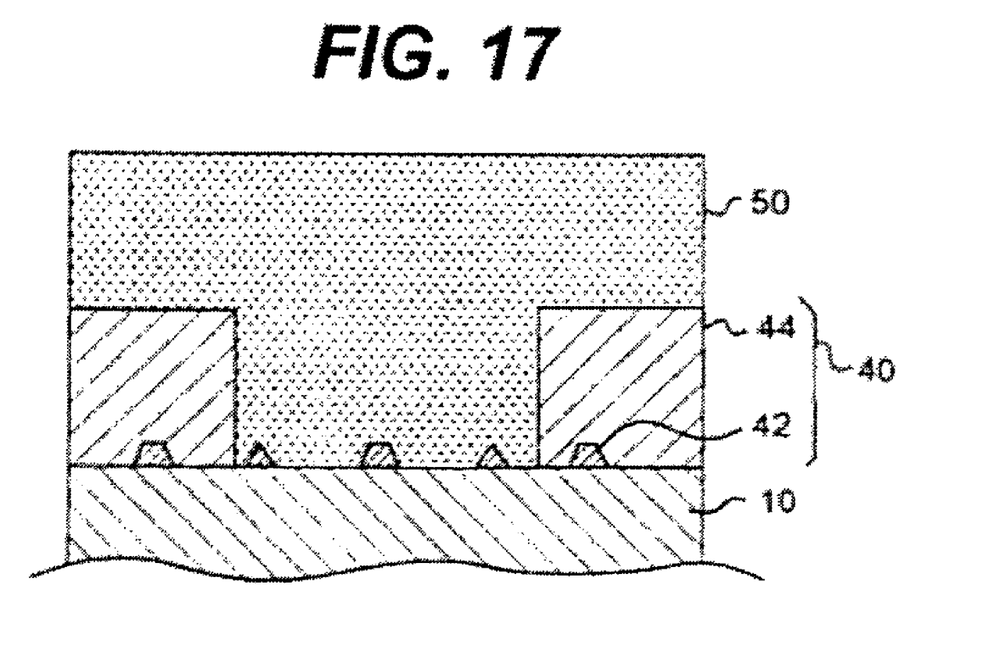
FIG. 17 is a cross sectional view of a channel layer, a contact layer, and a substrate.

On the drift layer 30, a gas mixture containing tetraethyl germanium as the organic germanium compound, trimethyl aluminum as the p-type conduction material and $H_2$ and Ar as the carrier gas is supplied and Ge granular crystals (F; Al-doped, carrier concentration: $5\times10^{15}$ $cm^{-3}$) having 0.5 μm height in the direction of the thickness of the SiC substrate 10 is epitaxially grown by a CVD method, for example, at 1000° C. (substrate temperature) (Ge granular crystal forming process), as depicted in the exemplary embodiment of FIG. 17. FIG. 2 and FIG. 3 show a cross sectional photograph and a surface photograph showing Ge granular crystals formed on the drift layer 30, respectively. As the germanium material, tetramethyl germanium, $GeF_4$, $GeH_{4-x}Cl_x$ (0≦x≦4), etc. can be used in addition to tetraethyl germanium.

It is necessary that the temperature for forming the Ge granular crystals is 1400° C. or lower, and 1300° C. or lower is preferred and 1200° C. or lower is more preferred. The Ge granular crystals may optionally contain silicon and carbon to form $Si_{1-x}Ge_xC$ crystals. In this case, x in the $Si_{1-x}Ge_xC$ crystals is preferably 0.00005 or more and, more preferably, 0.0001 or more. For incorporating silicon and carbon in the Ge granular crystals, a gas mixture with proper addition of $SiH_4$ or $C_3H_8$ may be used.

Succeeding to the Ge granular crystal forming process, a gas mixture containing tetraethyl germanium as the organic germanium compound, $SiH_4$ as the silane compound, $C_3H_8$ as the hydrocarbon compound, trimethyl aluminum as the p-type conduction material, and $H_2$ and Ar as the carrier gas is supplied above the drift layer 30 on which the Ge granular crystals have been formed. Then, by epitaxially growing $Si_{1-x}Ge_xC$ crystals (x=0.1) covering the Ge granular crystals by a CVD method, for example, at 1000° C. (substrate temperature) to form a cap layer ($P^-$; Al-doped, carrier concentration: $5\times10^{15}$ $cm^{-3}$) of 0.1 to 1 μm thickness including $Si_{1-x}Ge_xC$ crystals is formed on the surface of the drift layer 30 (cap layer forming process).

The forming temperature for the cap layer is preferably of from 500 to 1000° C. and it is, more preferably, a temperature that is equal to or lower than the Ge granular crystals growing temperature in order to prevent elimination of the Ge granular crystals by sublimation. x in the $Si_{1-x}Ge_xC$ crystals constituting the cap layer is, preferably, 0.3 or less and, more preferably, 0.2 or less.

After firming the cap layer of 0.1 to 1 μm thickness by the cap layer forming process, the gas mixture is supplied continuously while heating to 1600° C. (preferably 1400 to 2000° C.) to further epitaxially grow the $Si_{1-x}Ge_xC$ crystals (x=0.0001) till the layer thickness reaches 2 μm. The $Si_{1-x}Ge_xC$ crystals (x=0.02) may be epitaxially grown till they reach 2 μm at a Ge granular crystal forming temperature (1000° C.).

Since the Ge granular crystals are covered with the cap layer of 0.1 to 1 μm thickness, the Ge granular crystals are not eliminated by sublimation even when the $Si_{1-x}Ge_xC$ crystals (x=0.0001) are epitaxially grown while being heated to 1600° C. (preferably 1400 to 2000° C.).

Figure 4:
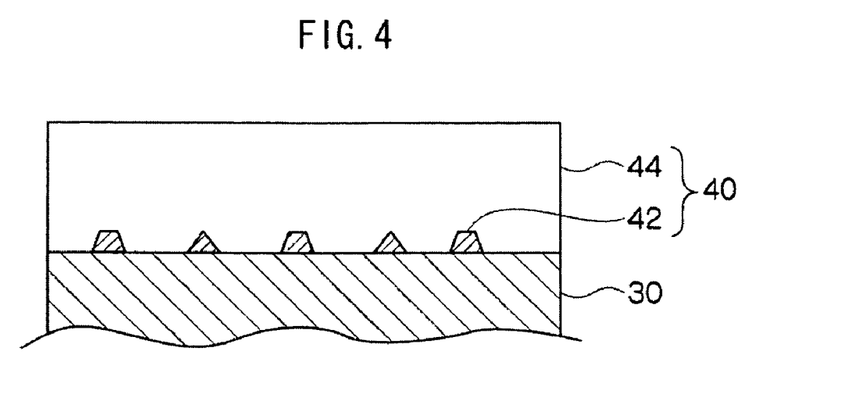
FIG. 4 is a cross sectional view of a channel layer 40.

Thus, the channel layer 40 is formed. FIG. 4 shows a cross sectional view of the channel layer 40. In the channel layer 40, the Ge granular crystals 42 are formed on the surface of the drift layer 30 and covered with the cap layer 44.

In the cap layer forming process described above, while the cap layer of 0.1 to 1 μm thickness is formed at a temperature identical with the Ge granular crystal growing temperature (1000° C.) and then the $Si_{1-x}Ge_xC$ crystals are epitaxially grown successively while being heated up to 1600° C. for preventing evaporation of the Ge granular crystals, formation of the cap layer can also be started from a temperature higher than the Ge granular crystal growing temperature.

A contact layer 50 ($N^+$; $N_2$-doped, carrier concentration: $3\times10^{18}$ $cm^{-3}$ or higher, 0.5 μm thickness) is epitaxially grown on the channel layer 40 by a CVD method, for example, at 1600° C. (substrate temperature) by supplying a gas mixture containing a silane compound $SiH_4$ as the silicon material, a hydrocarbon compound $C_3H_8$ as the carbon material, $N_2$ as the n-type conduction material, and $H_2$ as the carrier gas over the channel layer 40.

Figure 5:
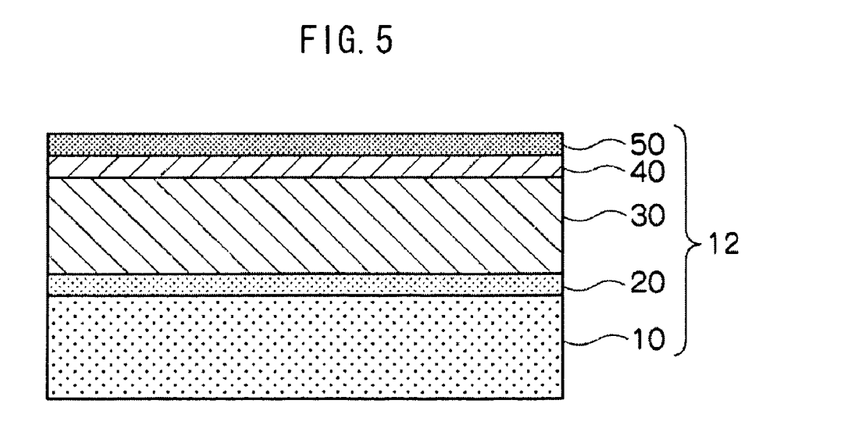
FIG. 5 is a view for explaining a manufacturing process of a silicon carbide semiconductor device according to the first embodiment.

As described above, a single crystal silicon carbide semiconductor substrate 12 shown in FIG. 5 in which the buffer layer 20, the drift layer 30, the channel layer 40, and the contact layer 50 are stacked in this order on the SiC substrate 10 is obtained.

Figure 6:
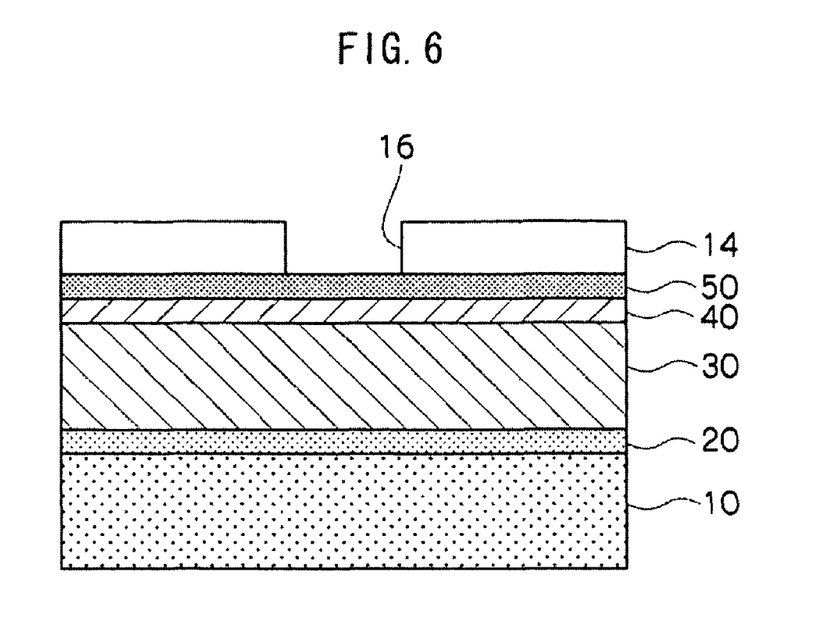
FIG. 6 is a view for explaining a manufacturing process of a silicon carbide semiconductor device according to the first embodiment.

Then, as shown in FIG. 6, an $SiO_2$ masking layer 14 (0.5 μm thickness) formed with an opening 16 corresponding to a region for forming a gate trench 60 is formed on the contact layer 50. The $SiO_2$ masking layer can be formed by using, for example, an LPCVD method, plasma CVD method, or sputtering method. Further, the opening 16 is formed by providing a photoresist opened at a portion corresponding to the opening 16 by photolithography on the $SiO_2$ masking layer 14 and etching a portion of the $SiO_2$ masking layer 14 corresponding to the opening 16 till the contact layer 50 is exposed by a dry etching technique of using a $CHF_3$ gas or the like or a wet etching technique using a chemical solution such as buffered hydrofluoric acid. After completing the etching of the $SiO_2$ masking layer 14, the photoresist is removed by an ashing device using $O_2$ plasmas, etc. or a resist peeling solution.

Figure 7:
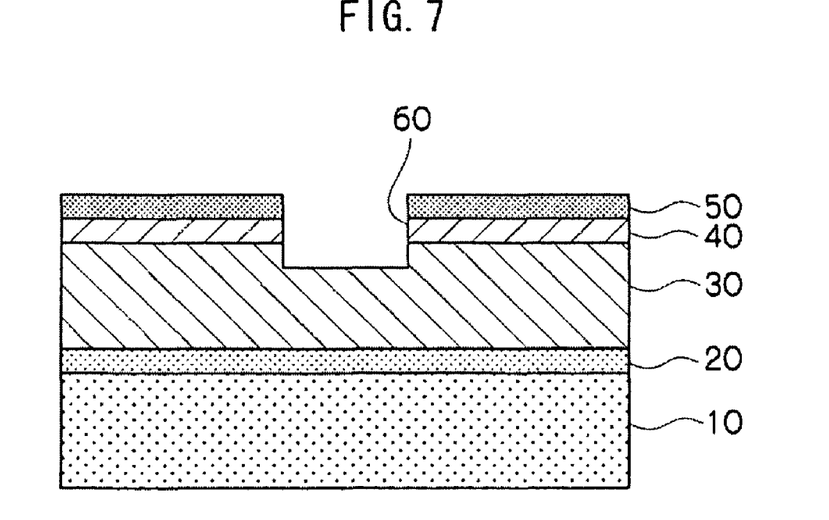
FIG. 7 is a view for explaining a manufacturing process of a silicon carbide semiconductor device according to the first embodiment.

Then, as shown in FIG. 7, a gate trench 60 of a width identical with that of the opening 16 passing through the contact layer 50 and the channel layer 40 and reaching the drill layer 30 is formed to a portion exposed at the opening 16 by a dry etching technique using an $SF_6$ gas or the like. The depth for the gate trench 60 is, for example, from 2.5 to 4.0 μm. The $SiO_2$ masking layer 14 is removed by a dry etching technique using a $CHF_3$ gas or the like or a wet etching technique by using a chemical solution such as a buffered hydrofluoric acid.

Figure 8:
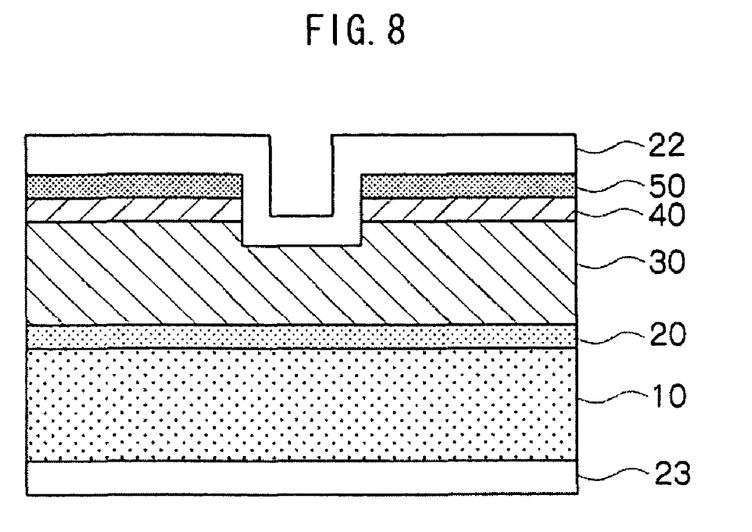
FIG. 8 is a view for explaining a manufacturing process of a silicon carbide semiconductor device according to the first embodiment.

Then, as shown in FIG. 8, oxide films 22, 23 including $SiO_2$ of 20 to 100 nm thickness are formed by a thermal oxidation method. In the thermal oxidation method, the single crystal silicon carbide semiconductor substrate 12 is heated in a thermal oxidation furnace in an oxygen atmosphere (oxygen concentration: 99.9% or higher) at 1000 to 1300° C., by which Si can be oxidized to form an oxide film over the entire surface of the single crystal silicon carbide semiconductor substrate 12. The thickness of the oxide films 22, 23 including $SiO_2$ can be controlled by properly selecting the oxygen concentration, the heating temperature, and the heating time. The oxide film 22 functions as a gate insulating film 80 and an insulating layer 82.

Figure 9:
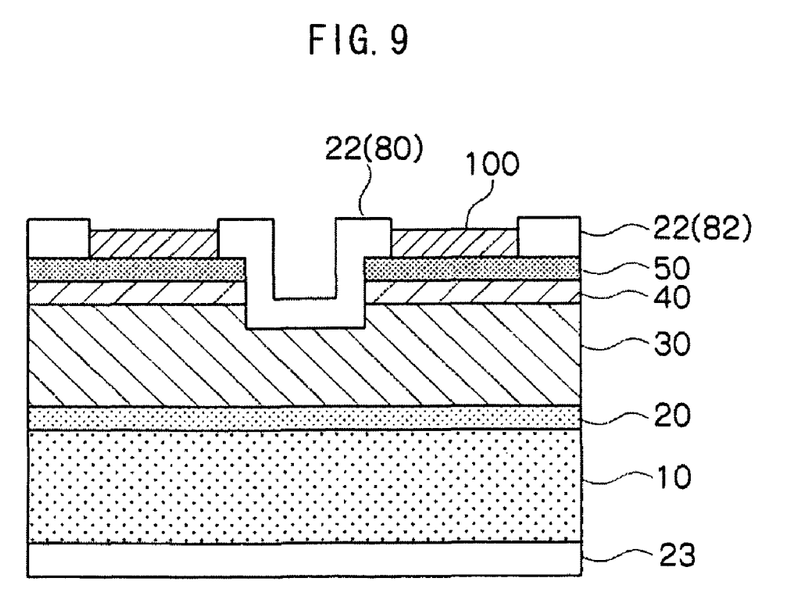
FIG. 9 is a view for explaining a manufacturing process of a silicon carbide semiconductor device according to the first embodiment.

A photoresist opened at a portion corresponding to a source electrode forming region by photolithography is provided on the oxide film 22, and a portion of the oxide film 22 where the photoresist is opened is removed by a dry etching technique using a $CHF_3$ gas or the like to expose the contact layer 50 corresponding to the source electrode forming region. Then, a metal film is formed on the photoresist by a vacuum vapor deposition technique. An unnecessary metal film formed on the photoresist is removed by using a resist peeling solution by a lift off method to form a predetermined pattern of a source electrode 100 as shown in FIG. 9. The thickness of the source electrode 100 can be set optionally within a range of from 50 to 1000 nm. The material for the electrode includes, for example, Ni, Ti, TiW, W, Mo, etc.

Figure 10:
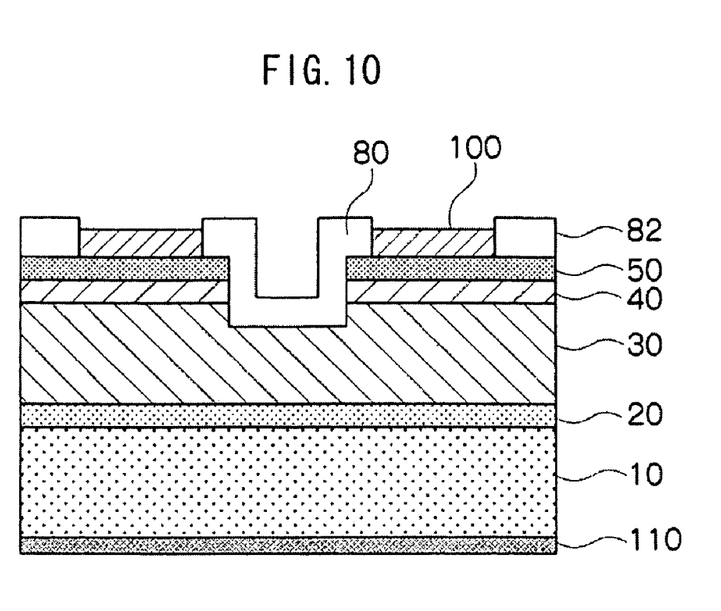
FIG. 10 is a view for explaining a manufacturing process of a silicon carbide semiconductor device according to the first embodiment.

Also on the oxide film 23, a photoresist opened at a portion corresponding to the drain electrode forming region is provided in the same manner as described above to expose the single crystal silicon carbide substrate 10 corresponding to the drain electrode forming region, and the drain electrode 110 is formed into a predetermined pattern shape as shown in FIG. 10. Alternatively, only the oxide film 23 in FIG. 9 is entirely removed by a dry etching technique using $CHF_3$ or the like to completely expose the single crystal silicon carbide substrate 10 and then the drain electrode 110 is formed over the entire surface. The thickness and the material for the drain electrode 110 can be made identical with those of the source electrode 100. After forming the source electrode 100 and the drain electrode 110, a heat treatment is applied, for example, at 1000° C. for 10 min in an Ar or $H_2$ atmosphere in order to obtain ohmic characteristics for the electrodes.

Figure 11:
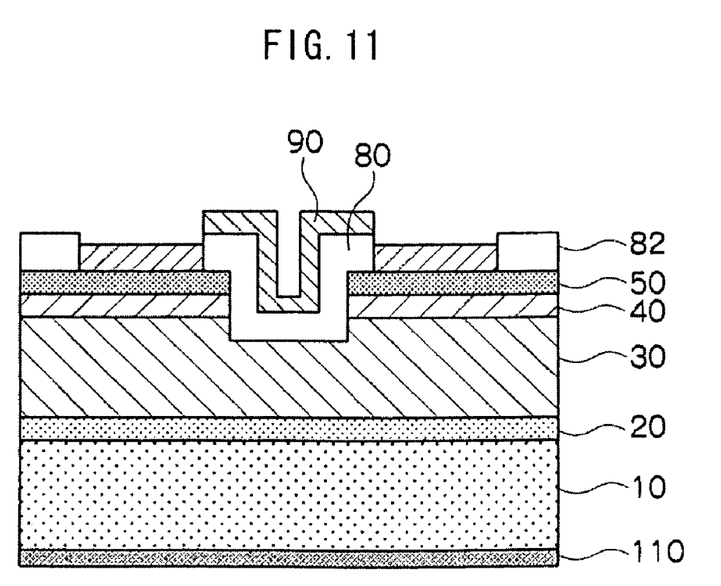
FIG. 11 is a view for explaining a manufacturing process of a silicon carbide semiconductor device according to the first embodiment.

Then, a photoresist opened at a portion corresponding to the gate electrode forming region is provided on the oxide film 22, a metal film is formed on the photoresist by a vacuum vapor deposition technique, and an unnecessary metal film formed on the photoresist is removed by using a resist peeling solution by a lift off method to form a gate electrode 90 as a predetermined pattern shape as shown in FIG. 11.

Figure 12:
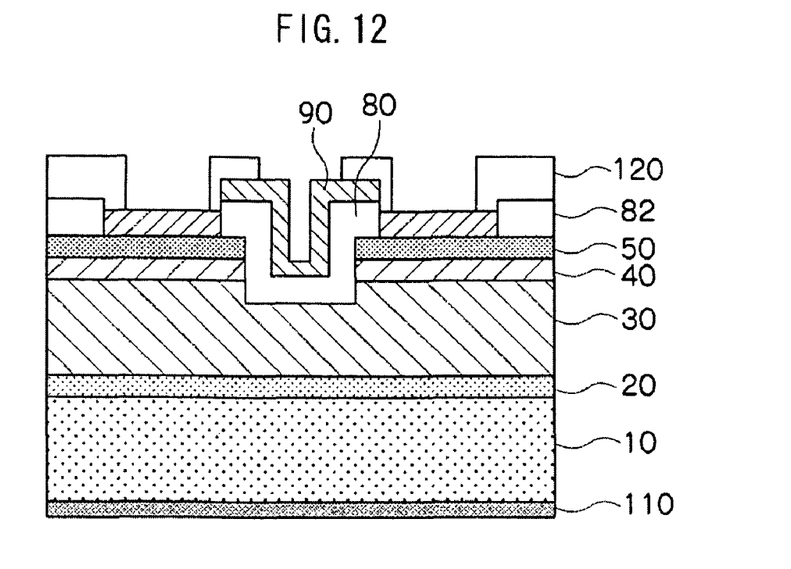
FIG. 12 is a view for explaining a manufacturing process of a silicon carbide semiconductor device according to the first embodiment.

Then, as shown in FIG. 12, an inter-layer insulating film 120 including $SiO_2$ having openings for exposing the source electrode 100 and the gate electrode 90 is formed by way of a CVD method on the surface of the single crystal silicon carbide semiconductor substrate 12 where the gate trench 60 is formed. The openings are formed by forming a photoresist opened at the portions for the source electrode 100 and the gate electrode 90 by photolithography on the inter-layer insulating film 120 and etching the inter-layer insulating film 120 till the source electrode 100 and the gate electrode 90 are exposed by a dry etching method using a $CHF_3$ gas or the like.

Figure 13:
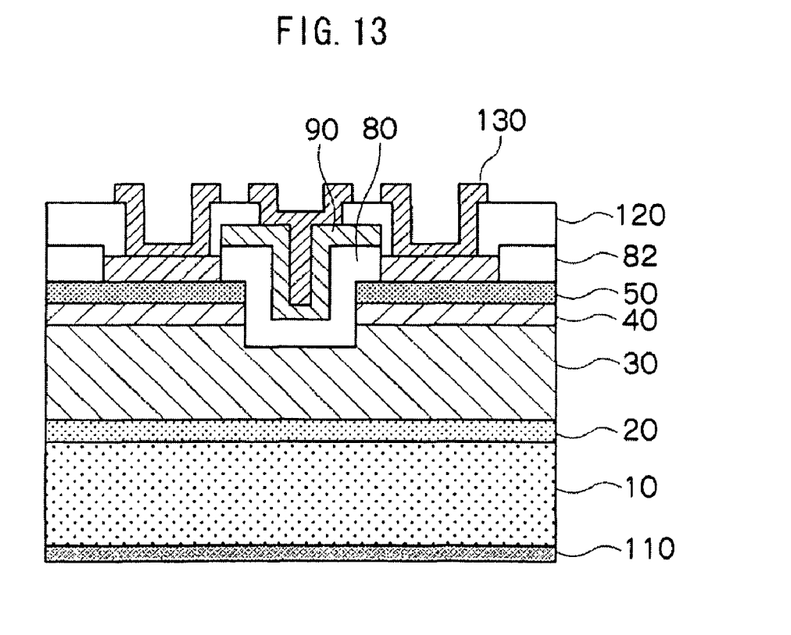
FIG. 13 is a view for explaining a manufacturing process of a silicon carbide semiconductor device according to the first embodiment.

Then, as shown in FIG. 13, an interconnection electrode 130 is formed by the same method as that for forming the source electrode 100. The material for the interconnection electrode 130 includes, for example, a film of Ti and Al, a film of Ti, TiN, and Al, etc. The layer thickness used for the interconnection electrode 130 can be set optionally in a range of from 0.01 to 0.5 μm for the thickness of Ti, in a range of from 0.1 to 10 μm for the thickness of Al, and in a range of from 0.01 to 0.5 μm for TiN.

Then, after forming the surface protection layer 140 including $SiO_2$ on the interconnection electrode 130 by an LPCVD method, a plasma CVD method, a sputtering method or the like, openings exposing the interconnection electrode 130 on the source electrode 100 and the gate electrode 90 are formed by using a photolithographic technique and a dry etching technique. For the surface protection layer 140, SiON can also be used in addition to $SiO_2$. Further, a rear face electrode 150 including Ni, Ti, Pt, Au, etc. is formed on the drain electrode 110 by a vapor deposition method. By way of the steps described above, the silicon carbide semiconductor device shown in FIG. 1 is completed.

In the silicon carbide semiconductor device according to the first embodiment, the Ge granular crystals 42 may also be in contact with the drift layer 30 and the contact layer 50. This can further improve the carrier mobility.

Figure 15:
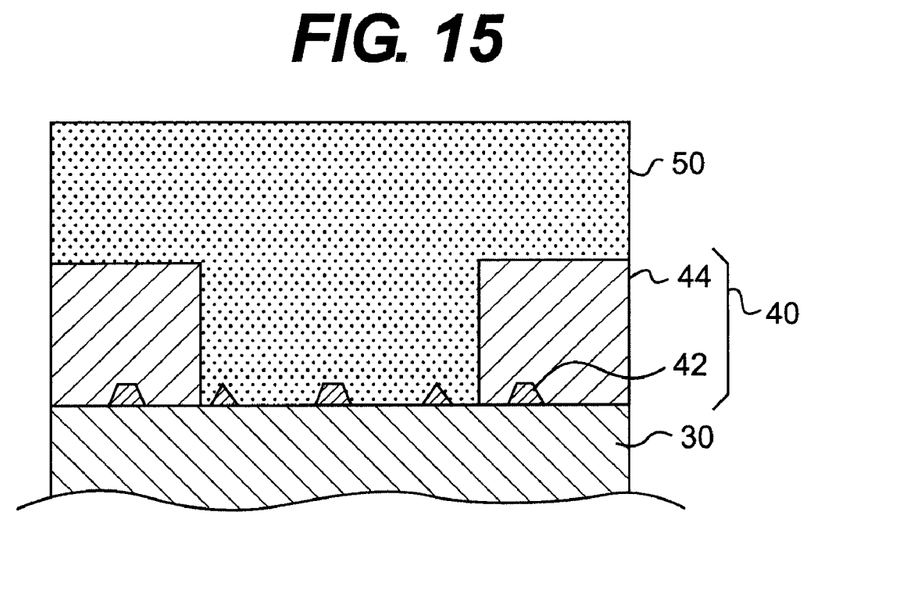
FIG. 15 is a cross sectional view of a channel layer and a contact layer.

The Ge granular crystals 42 can be in contact with the SiC drift layer 30 and the contact layer 50 in the method of manufacturing the silicon carbide semiconductor device of the invention by etching the cap layer 44 formed on the drift layer 30 till the Ge granular crystals 42 are exposed by a dry etching technique using an $SF_6$ gas or the like and then forming the contact layer 50, or by etching the cap layer 44 at 1000 to 2000° C. in an $H_2$ gas atmosphere in the CVD apparatus till the Ge granular crystals 42 are exposed and then forming the contact layer 50, as depicted in the exemplary embodiment of FIG. 15. In a case of etching the cap layer in the CVD apparatus, the cap layer 44 can be etched at a rate of 0.4 μm/hr under the conditions, for example, at 1750° C. and 40 Torr.

Smoothness on the surface of the semiconductor can be improved by the etching described above. For that purpose, the surface smoothness of the cap layer 44 (that is, the channel layer 40) can be improved by forming the cap layer 44 of a thickness more than a desired thickness and then forming the cap layer 44 to the desired thickness by the etching described above.

In a case of forming the contact layer 50 in a state of exposing the Ge granular crystals 42, it is preferred to form the contact layer 50 by starting epitaxial growing of the contact layer 50 from the temperature identical with the temperature of epitaxially growing the Ge granular crystals 42 and then forming the contact layer 50 while gradually increasing the growing temperature. This can prevent elimination of the Ge granular crystals 42 by sublimation.

Further, in the silicon carbide semiconductor device according to the first embodiment, the contact layer 50 may include Ge granular crystals. The conditions and the materials to be used for forming the Ge granular crystals constituting the contact layer 50 are identical with those for the Ge granular crystals 42. Specifically, a gas mixture containing tetraethyl germanium as the organic germanium compound, $N_2$ as the n-type conduction material, and $H_2$ or Ar as the carrier gas is supplied above the channel layer 40. Then, Ge granular crystals (N$^+$; $N_2$-doped, carrier concentration: $1 \times 10^{19}$ cm$^{-3}$) of 0.1 μm height in the direction of the thickness of the SiC substrate 10 can be formed by epitaxial growing, for example, at 1000° C. (substrate temperature) by a CVD method (Ge granular crystal forming process). By constituting the contact layer 50 with the Ge granular crystals, the contact resistance of the source electrode 100 can be decreased. As a result, the mobility of carriers can be improved.

Figure 16:
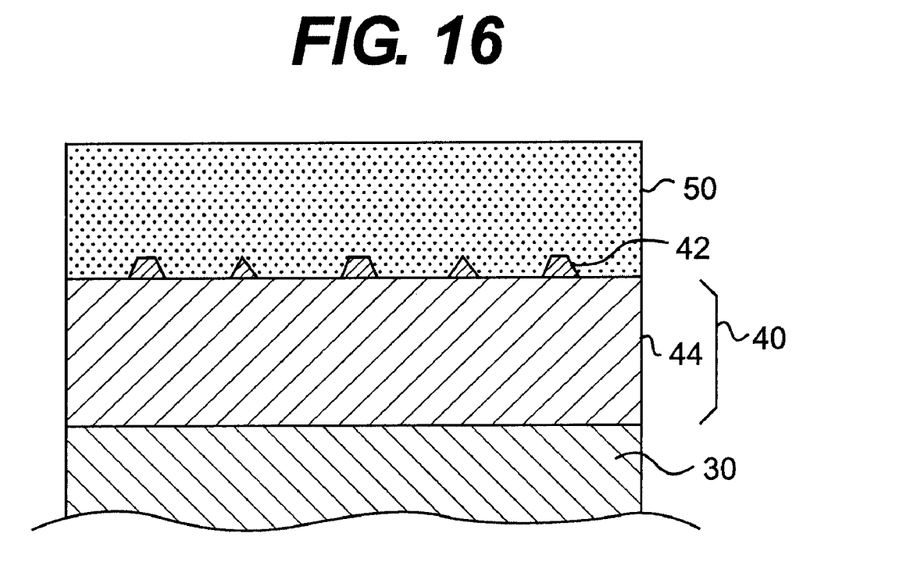
FIG. 16 is another cross sectional view of a channel layer and a contact layer.

The contact layer 50 may further contain $Si_{1-x}Ge_xC$ crystals ($0 \leq x < 1$) covering the Ge granular crystals and at a lower Ge concentration than the Ge granular crystals together with the Ge granular crystals described above. The conditions and the materials to be used for forming the $Si_{1-x}Ge_xC$ crystals ($0 \leq x < 1$) are identical with those in the case of the cap layer 44. Specifically, succeeding to the Ge granular crystals forming process, a gas mixture containing tetraethyl germanium as the organic germanium compound, $SiH_4$ as the silane compound, $C_3H_8$ as the hydrocarbon compound, $N_2$ as the n-type conduction material, and $H_2$ or Ar as a carrier gas is supplied above the channel layer 40 on which the Ge granular crystals have been formed, as depicted in the exemplary embodiment of FIG. 16, and $Si_{1-x}Ge_xC$ crystals (x=0.02) covering the Ge granular crystals are grown epitaxially by a CVD method, for example, at 1000° C. (substrate temperature), to form a cap layer (N$^+$, $N_2$-doped, carrier concentration: $1 \times 10^{19}$ cm$^{-3}$) including the crystals constituting the contact layer with a thickness of from 0.01 to 0.1 μm on the surface of the channel layer 40 (process of forming the cap layer in the contact layer).

After forming the cap layer constituting the contact layer with a thickness of from 0.01 to 0.1 μm by the process of forming the cap layer in the contact layer, the cap layer constituting the contact layer is successively grown epitaxially at 1600° C. till the thickness reaches 0.5 μm. The surface of the contact layer 50 can be made smooth by covering the Ge granular crystals constituting the contact layer 50 with the cap layer constituting the contact layer.

In the first embodiment, the Ge granular crystals and the cap layer may also contain a dopant such as Al or N.

Figure 14:
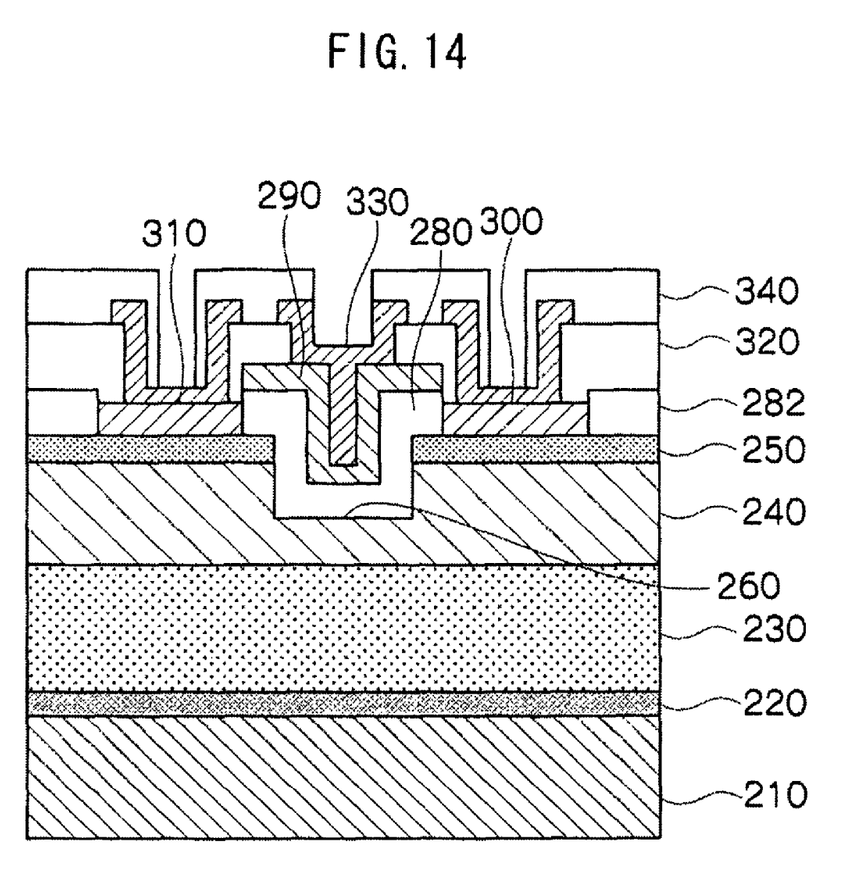
FIG. 14 is a cross sectional view showing a second embodiment of a silicon carbide semiconductor device of the invention.

FIG. 14 is a cross sectional view showing a second embodiment of the silicon carbide semiconductor device according to the invention. The silicon carbide semiconductor device of this embodiment is constructed as a lateral MOS field effect transistor (MOSFET) in which a gate electrode is constituted as a MOS structure and carriers move between the source electrode and the drain electrode disposed on one surface of the silicon carbide substrate in the direction of the plane of the silicon carbide substrate in the device.

In the MOSFET of this embodiment, an SiC buffer layer 220 (P; Al-doped, carrier concentration: $1 \times 10^{16}$ cm$^{-3}$) of 1 μm thickness, an SiC field layer 230 (P; Al-doped, carrier concentration: $1 \times 10^{17}$ cm$^{-3}$) of 3 μm thickness, a channel layer 240 of 2.0 to 2.2 μm thickness including Ge granular crystals (P$^-$; Al-doped, carrier concentration: $1 \times 10^{17}$ cm$^{-3}$) disposed on the SiC field layer 230 having 0.2 μm height in the direction of the thickness of an SiC substrate 210 and a cap layer (P$^-$; Al-doped, carrier concentration: $1 \times 10^{17}$ cm$^{-3}$) of 2.0 μm thickness covering the Ge granular crystals, and an SiC contact layer 250 (N$^+$; $N_2$-doped, carrier concentration: $3 \times 10^{18}$ cm$^{-3}$ or more) are stacked in this order on the single crystal silicon carbide substrate (SiC substrate) 210 (4H—SiC (0001) 8° off toward [11-20], carrier concentration (P: $1 \times 10^{16}$ cm$^{-3}$) of 350 μm thickness).

The thickness of the single crystal silicon carbide substrate 210 is properly selected within a range of from 300 to 500 μm. The thickness of the buffer layer 220 is properly selected within a range of from 0.1 to 2.0 μm. The thickness of the field layer 230 is properly selected within a range of from 0.5 to 5 μm. The thickness of the channel layer 240 is properly selected within a range of from 0.2 to 5 μm. The thickness of the contact layer 250 is properly selected within a range of from 0.1 to 1.0 μm.

A gate trench 260 passing through the contact layer 250 and reaching the channel layer 240 is formed on the side of the single crystal silicon carbide substrate 210 where the buffer layer 220 and the like are stacked. The depth for the gate trench 260 is, for example, from 0.3 to 5.5 μm.

A gate insulating film 280 including $SiO_2$ is formed on the surface of the gate trench 260. The thickness of the gate insulating film 280 is selected properly within a range of from 30 to 100 nm. The gate insulating film 280 is formed so as to cover a portion of the surface of the contact layer 250 and functions as an insulating layer 282. The thickness of the insulating layer 282 can be properly selected within a range of from 30 to 100 nm.

The surface of the gate insulating film 280 is covered with a gate electrode 290. A source electrode 300 and a drain electrode 310 are formed on the surface of a portion of the contact layer 250 (surface not formed with the insulating layer 282).

The gate electrode 290 and the insulating layer 282 are covered with an inter-layer insulating film 320 including $SiO_2$. The thickness of the inter-layer insulating film 320 can be properly selected within a range of from 0.1 to 2.0 μm.

On the inter-layer insulating film 320, an interconnection electrode 330 in contact with the source electrode 300, the drain electrode 310 and the gate electrode 290 is formed, and a surface protection layer 340 including $SiO_2$ is formed so as to cover the interconnection electrode 330. The thickness of the surface protection layer 340 can be selected properly within a range of from 0.1 to 2.0 μm.

The operation principle of the silicon carbide semiconductor device according to the second embodiment is to be described. When a voltage is applied to the gate electrode 290, the conduction type of the channel layer 240 is reversed to form a channel region and carriers move between the source electrode 300 and the drain electrode 310. The channel layer 240 acts as a channel forming region. Since the channel layer 240 contains Ge granular crystals of large mobility of carriers, the silicon carbide semiconductor device according to this embodiment has low on resistance and is excellent in the device characteristics.

As the process of manufacturing the silicon carbide semiconductor device according to the second embodiment, the same method as the method for manufacturing the silicon carbide semiconductor device of the invention described above can be used.

In the second embodiment, the Ge granular crystals and the cap layer may also contain a dopant such as Al or N.

The disclosure in Japanese Patent Application No. 2006-215999 is incorporated by reference herein.

All publication, patent applications, and technical standards mentioned in this specification are herein incorporated by reference to the same extent as if each individual publication, patent application, or technical standard was specifically and individually indicated to be incorporated by reference.

The invention claimed is:

1. A silicon carbide semiconductor device that controls the flow of carriers between a source region and a drain region by a gate voltage, comprising:
   a silicon carbide substrate, and
   a channel layer that is disposed on or above the silicon carbide substrate, constitutes at least a portion of a carrier flow path between the source region and the drain region, and contains $Si_{1-x}Ge_xC$ crystals ($0 \leq x < 1$) and Ge granular crystals at a higher Ge concentration than that of the $Si_{1-x}Ge_xC$ crystals.

2. The silicon carbide semiconductor device according to claim 1, further comprising a contact layer on or above the channel layer.

3. The silicon carbide semiconductor device according to claim 2, wherein the Ge granular crystals are in contact with the silicon carbide substrate and the contact layer.

4. The silicon carbide semiconductor device according to claim 2, wherein the contact layer comprises Ge granular crystals formed on a surface of the channel layer.

5. The silicon carbide semiconductor device according to claim 4, wherein the contact layer further contains $Si_{1-x}Ge_xC$ crystals ($0 \leq x < 1$) at a lower Ge concentration than that of the Ge granular crystals.

6. A method for manufacturing a silicon carbide semiconductor device according to claim 1, comprising,
   forming additional Ge granular crystals, at a temperature of 1400° C. or less, by supplying a gas mixture containing a germanium material on or above the channel layer thereby growing the additional Ge granular crystals on a surface of the channel layer.

7. The method for manufacturing a silicon carbide semiconductor device according to claim 6, further comprising forming a cap layer by supplying a gas mixture containing a silicon material and a carbon material on or above the silicon carbide substrate on which the Ge granular crystals have been formed or on or above the channel layer on which the additional Ge granular crystals have been formed while heating from a temperature that is equal to or lower than the Ge granular crystal growing temperature in the forming of the Ge granular crystals up to a temperature of 1400 to 2000° C., thereby epitaxially growing $Si_{1-x}Ge_xC$ crystals ($0 \leq x < 1$) covering the Ge granular crystals to form the cap layer comprising the $Si_{1-x}Ge_xC$ crystals ($0 \leq x < 1$) on the surface of the silicon carbide substrate or the surface of the channel layer.

8. The method for manufacturing a silicon carbide semiconductor device according to claim 6, further comprising forming a cap layer by supplying a gas mixture containing a silicon material, a carbon material and a second germanium material on or above the silicon carbide substrate on which the Ge granular crystals have been formed or on or above the channel layer on which the additional Ge granular crystals have been formed while heating from a temperature that is equal to or lower than the Ge granular crystal growing temperature in the forming of the Ge granular crystals up to a temperature of 1400 to 2000° C., thereby epitaxially growing $Si_{1-x}Ge_xC$ crystals ($0 \leq x < 1$) covering the Ge granular crystals to form the cap layer comprising the $Si_{1-x}Ge_xC$ crystals ($0 < x < 1$) on the surface of the silicon carbide substrate or the surface of the channel layer.

* * * * *

UNITED STATES PATENT AND TRADEMARK OFFICE
CERTIFICATE OF CORRECTION

| | | |
|---|---|---|
| PATENT NO. | : 8,053,784 B2 | Page 1 of 1 |
| APPLICATION NO. | : 12/376362 | |
| DATED | : November 8, 2011 | |
| INVENTOR(S) | : Akinori Seki, Yukari Tani and Noriyoshi Shibata | |

It is certified that error appears in the above-identified patent and that said Letters Patent is hereby corrected as shown below:

Claim 8, col. 12, line 26, "($0 \leqq x <$)" should read --($0 < x <$)--

Signed and Sealed this
Tenth Day of April, 2012

David J. Kappos
*Director of the United States Patent and Trademark Office*